(12) United States Patent
Heidari et al.

(10) Patent No.: US 7,403,048 B2
(45) Date of Patent: Jul. 22, 2008

(54) DIVIDER CIRCUITS AND METHODS USING IN-PHASE AND QUADRATURE SIGNALS

(75) Inventors: Mohammad E Heidari, Los Angeles, CA (US); Ahmad Mirzaei, Los Angeles, CA (US); Masoud Djafari, Marina Del Rey, CA (US); Rahim Bagheri, Los Angeles, CA (US)

(73) Assignee: WiLinx Corporation, Los Angeles, CA (US)

( * ) Notice: Subject to any disclaimer, the term of this patent is extended or adjusted under 35 U.S.C. 154(b) by 0 days.

(21) Appl. No.: 11/142,575

(22) Filed: Jun. 1, 2005

(65) Prior Publication Data

US 2007/0024329 A1    Feb. 1, 2007

(51) Int. Cl.
*H03B 19/00* (2006.01)

(52) U.S. Cl. .................. 327/117; 327/115; 327/360; 377/47

(58) Field of Classification Search .......... 327/115, 327/117, 118, 355–360, 202, 203, 208–212, 327/218; 377/47, 48
See application file for complete search history.

(56) References Cited

U.S. PATENT DOCUMENTS

| | | | | |
|---|---|---|---|---|
| 5,216,295 A * | 6/1993 | Hoang | .................. | 326/115 |
| 5,945,858 A * | 8/1999 | Sato | .................. | 327/202 |
| 6,072,850 A * | 6/2000 | Ueno | .................. | 377/47 |
| 6,163,181 A | 12/2000 | Nishiyama | | |
| 6,242,965 B1 * | 6/2001 | Pickering et al. | .................. | 327/359 |
| 6,348,830 B1 * | 2/2002 | Rebeiz et al. | .................. | 327/355 |
| 6,411,669 B1 * | 6/2002 | Kim | .................. | 377/48 |
| 6,433,595 B1 * | 8/2002 | Tung et al. | .................. | 327/115 |
| 6,556,056 B1 * | 4/2003 | Tung et al. | .................. | 327/115 |
| 6,683,480 B2 | 1/2004 | Zhang et al. | | |
| 6,686,787 B2 * | 2/2004 | Ling | .................. | 327/203 |
| 6,810,242 B2 * | 10/2004 | Molnar et al. | .................. | 455/326 |
| 6,842,054 B2 * | 1/2005 | Wang | .................. | 327/115 |
| 7,187,217 B2 * | 3/2007 | Marutani | .................. | 327/117 |
| 2001/0022537 A1 * | 9/2001 | Melava et al. | .................. | 331/16 |
| 2002/0039894 A1 * | 4/2002 | Yoshida et al. | .................. | 455/265 |
| 2002/0097072 A1 | 7/2002 | Wakada et al. | | |
| 2003/0048117 A1 | 3/2003 | Tung et al. | | |
| 2003/0189449 A1 | 10/2003 | Zhang et al. | | |

(Continued)

OTHER PUBLICATIONS

Hung, et al. "Fully Integrated 5.35-GHz CMOS VCOs and Prescalers", IEEE Transactions on Microwave Theory and Techniques, vol. 49, No. 1, Jan. 2001, pp. 17-22.

(Continued)

*Primary Examiner*—N. Drew Richards
*Assistant Examiner*—William Hernandez
(74) *Attorney, Agent, or Firm*—Fountainhead Law Group PC; Chad R. Walsh

(57) ABSTRACT

Embodiments of the present invention include circuits and methods for dividing signals. In one embodiment the present invention includes a divider circuit comprising at least one first divider input receiving an in-phase (I+) signal, at least one second divider input receiving a complement of the in-phase (I−) signal, at least one third divider input receiving a quadrature (Q+) signal, and at least one fourth divider input receiving a complement of the quadrature (Q−) signal. In one embodiment, the lock range of a divider is improved by providing a first bias current greater than a second bias current.

20 Claims, 7 Drawing Sheets

U.S. PATENT DOCUMENTS

| | | | |
|---|---|---|---|
| 2003/0193355 A1 | 10/2003 | Leifso et al. | |
| 2004/0140831 A1 | 7/2004 | Wang | |
| 2004/0229589 A1* | 11/2004 | Behzad | 455/285 |
| 2005/0104634 A1* | 5/2005 | Fujishima | 327/117 |
| 2005/0170806 A1* | 8/2005 | Kim | 455/323 |

OTHER PUBLICATIONS

Fujishima, et al., "A 1.0V 10.2 CHz CMOS Frequency Divider with Differential Injection Locking", IEEE Topical Conference on Wireless Communication Technology 2003, pp. 164-165.

Craninckx, et al., "A CMOS 1.8GHz Los-Phase-Noise Voltage-Controlled Oscillator with Prescaler", IEEE International Solid-State Circuits Conference 1995, pp. 266-267.

Betancourt-Zamora, "1-GHz and 2.8-GHz CMOS Injection-locked Ring Oscillator Prescaller", Symosium on VLSI Circuits, Kyoto, Japan, Jun. 14, 2001.

Office Action for U.S. Appl. No. 11/142,705 mailed Aug. 18, 2006.

Office Action for U.S. Appl. No. 11/142,705 mailed Mar. 28, 2007.

Notice of Allowance for U.S. Appl. No. 11/142,705 mailed Jul. 6, 2007.

* cited by examiner

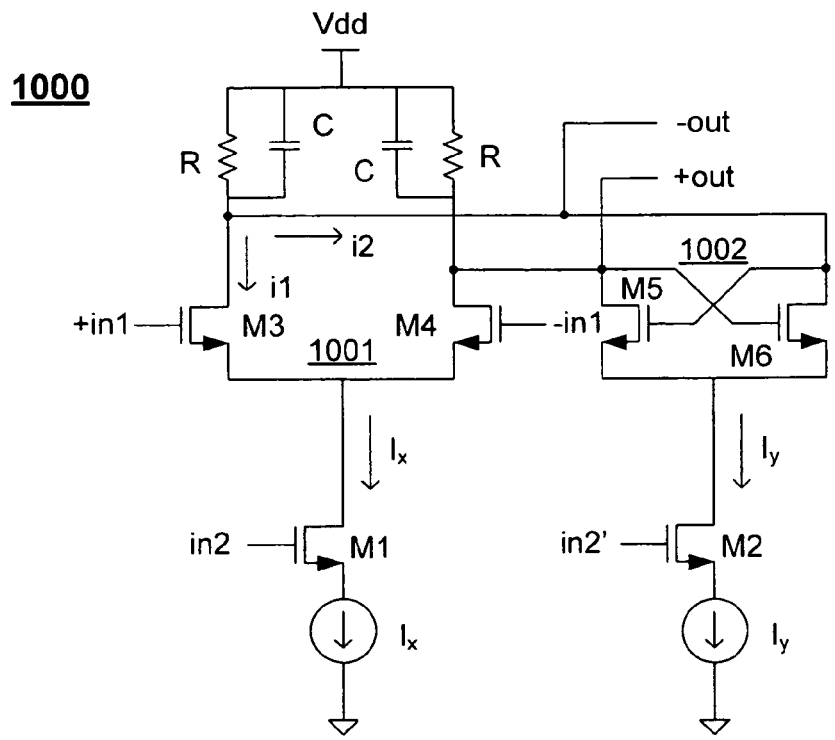
Fig. 10A
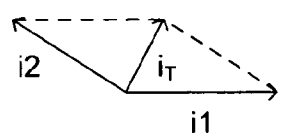 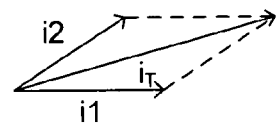
Fig. 10B        Fig. 10C

DIVIDER CIRCUITS AND METHODS USING IN-PHASE AND QUADRATURE SIGNALS

BACKGROUND

The present invention relates to divider circuits, and in particular, to circuits and methods that may be used to implement frequency division using in-phase and quadrature signals.

Electronic systems often have many different components that include voltage or current signals that have different frequencies. It is often desirable to modify the frequencies of such signals as the signals are used to perform different tasks. One common modification to a signal is frequency division. Frequency division is the process of dividing a signal's frequency by some value (e.g., an integer or fraction). Circuits that perform frequency division are referred to as "Dividers" and are found in a wide variety of electronic applications.

FIG. 1 illustrates a prior art divider circuit. A divider circuit 100 receives an input signal, Vin, and generates an output signal, Vout. The input signal, Vin, may be a square wave, for example, having a period, T1, and a corresponding frequency, F1=1/T1. The output signal, Vout, of divider circuit 100 may have some frequency that is less than the frequency of the input signal, Vin. For example, the output signal, Vout, may have a period, T2, that is twice the value of the input signal period, T1, and thus the output frequency, Fout, has a frequency that is one-half the frequency of the input signal, Vin.

FIG. 2 illustrates a prior art D-Flip Flop divider circuit. The circuit includes two D-flip flops ("DFF") 201 and 202 connected in series. In this example, each DFF has differential inputs (+in, −in), differential outputs (+out, −out) and differential clock inputs (CK and $\overline{CK}$). DFF 201 will load data at its input (i.e., from DFF 202) on the rising edge of CK. Similarly, DFF 202 will load data at its input (i.e., from DFF 201) on the falling edge of CK, which is the rising edge of $\overline{CK}$. Thus, each DFF output will transition between logic states once for every period of CK. Consequently, the period of each DFF output is twice the period of the clock, and the output of the divider has one-half the frequency of the clock. The output of the circuit may be taken from either DFF 201 (i.e., +OUT1_DIV2 and −OUT1_DIV2) or DFF 202 (i.e., +OUT2_DIV2 and −OUT2_DIV2). DFFs 201 and 202 have, thus, divided the clock frequency by two. Such a circuit is one example of a divide-by-two circuit.

One problem associated with prior art divider circuits is that typically only one of the output pairs of the divider are used to drive subsequent stages in the system. FIG. 3 illustrates a prior art approach used for series connected divider circuits. Circuit 300 includes a first divider circuit 301 receiving differential clock inputs and using one of the differential outputs to drive a second divider circuit 302. If only one pair of divider outputs is used to drive subsequent stages, the DFF circuits in the divider will not be subject to equal loading. Such load imbalances may cause degradations in the circuit's behavior and performance. One prior art approach to balancing the circuit is to use a "replica dummy load" 303. Replica circuit 303 is typically a circuit that replicates the loading effects of the active circuit connected to the active outputs of divider 301, but does not process any signals and has no other purpose except to provide load balancing. While such circuits are useful for load balancing, they are disadvantageous because they can consume additional power and take up additional area on an integrated circuit, thereby reducing efficiency and increasing the cost.

Another problem associated with prior art divider circuits is that the internal operating parameters of the system are often not working efficiently to achieve the desired results. Fig 4A illustrates a prior art implementation of a circuit 400 that may be used in a divider circuit. Circuit 400 includes a differential pair 401 and a cross-coupled pair 402 that are coupled together at a common load. Circuit 400 receives differential clock inputs at transistors M1 and M2. When the circuit is connected in a divide-by-two configuration with another similar circuit, the inputs +in1 and −in1 will be received on the gate terminals of transistors M3 and M4. Differential pair 401 and cross-coupled pair 402 will generate currents i1 and i2. Fig 4B illustrates the currents i1 and i2 in the circuit of FIG. 4A. In many applications, it is desirable to design a circuit such that these currents are operating at an optimum for the particular system in which such circuit is used. If these currents are not designed efficiently, for example, the circuit and system in which it is used may not perform as well. This problem is particularly important in high frequency applications.

Thus, there is a need for improved divider circuits, and in particular, for improved circuits and methods that may be used to implement frequency division using in-phase and quadrature signals.

SUMMARY

Embodiments of the present invention improves the performance of divider circuits. In one embodiment, the present invention includes a divider circuit comprising at least one first divider input receiving an in-phase (I+) signal, at least one second divider input receiving a complement of the in-phase (I−) signal, at least one third divider input receiving a quadrature (Q+) signal, and at least one fourth divider input receiving a complement of the quadrature (Q−) signal.

In one embodiment, the divider circuit further comprising a first divider output producing an in-phase (I+) signal, a second divider output producing a complement of the in-phase (I−) signal, a third divider output producing a quadrature (Q+) signal, and a fourth divider output producing a complement of the quadrature (Q−) signal.

In one embodiment, the divider circuit is a divide-by-two. The divider circuit may comprise first and second D-type flip flops. In one example embodiment, the first and second D-type flip flops each comprise a differential circuit having first and second inputs to receive a first differential signal, a first frequency control input, and first and second differential output nodes. The first and second D-type flip flops further include a cross-coupled circuit having a first control terminal coupled to a second output of the cross-coupled circuit and the first differential output node, a second control terminal coupled to a first output of the cross coupled circuit and the first differential output node, and a second frequency control input. In another example, the first frequency control input in the first D-type flip flop receives a first quadrature signal, the second frequency control input in the first D-type flip flop receives a first in-phase signal, the first frequency control input in the second D-type flip flop receives the complement of the quadrature signal, and the second frequency control input in the second D-type flip flop receives the complement of the in-phase signal.

In one embodiment, the divider circuit is a divide-by-six. The divider circuit may comprise first, second, third, fourth, fifth, and sixth D-type flip flops, for example. In one example embodiment, the first, second, third, fourth, fifth, and sixth D-type flip flops each comprise a differential circuit having first and second inputs to receive a first differential signal, a first frequency control input, and first and second differential output nodes. The D-type flip flops further include a cross-coupled circuit having a first control terminal coupled to a second output of the cross-coupled circuit and the first differential output node, a second control terminal coupled to a first output of the cross coupled circuit and the first differential output node, and a second frequency control input. In one example implementation, the first frequency control input in the first, third, and fifth D-type flip flops receive a first quadrature signal, the second frequency control input in the first, third, and fifth D-type flip flops receive a first in-phase signal, the first frequency control input in the second, fourth, and sixth D-type flip flops receive a first complement of the quadrature signal, and the second frequency control input in the second, fourth, and sixth D-type flip flops receive a first complement of the in-phase signal.

In one embodiment, the divider circuit comprises a plurality of circuits each comprising a differential circuit having a first bias current and a cross-coupled circuit having a second bias current, wherein the first bias current is greater than the second bias current. In one example implementation, the ratio of the first bias current to the second bias current is within a range from 2 to 3.

Embodiments of the present invention also include methods of dividing signals. In one embodiment, the present invention includes a method of dividing a signal comprising receiving an in-phase (I+) signal on at least one first divider input, receiving a complement of the in-phase (I−) signal on at least one second divider input, receiving a quadrature (Q+) signal on at least one third divider input, and receiving a complement of the quadrature (Q−) signal on at least one fourth divider input. In one embodiment, the method further comprises producing an in-phase (I+) signal on a first divider output, producing a complement of the in-phase (I−) signal on a second divider output, producing a quadrature (Q+) signal on a third divider output, and producing a complement of the quadrature (Q−) signal on a fourth divider output.

The following detailed description and accompanying drawings provide a better understanding of the nature and advantages of the present invention.

BRIEF DESCRIPTION OF THE DRAWINGS

FIG. 10A is an example of a D-type flip flop used in a divide-by-six according to one embodiment of the present invention.

FIG. 10B-C illustrates the currents in the circuit of FIG. 10A.

DETAILED DESCRIPTION

Described herein are techniques for implementing frequency division. In the following description, for purposes of explanation, numerous examples and specific details are set forth in order to provide a thorough understanding of the present invention. It will be evident, however, to one skilled in the art that the present invention as defined by the claims may include some or all of the features in these examples alone or in combination with other features described below, and may further include modifications and equivalents of the features and concepts described herein.

Figure 1:
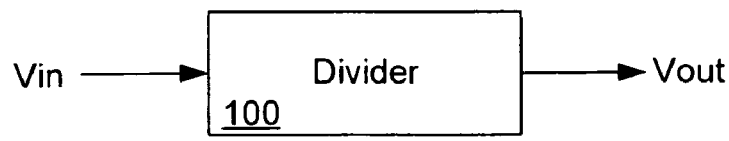
FIG. 1 illustrates a prior art divider circuit.
Figure 1:
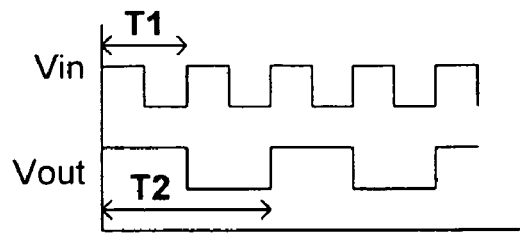
Figure 2:
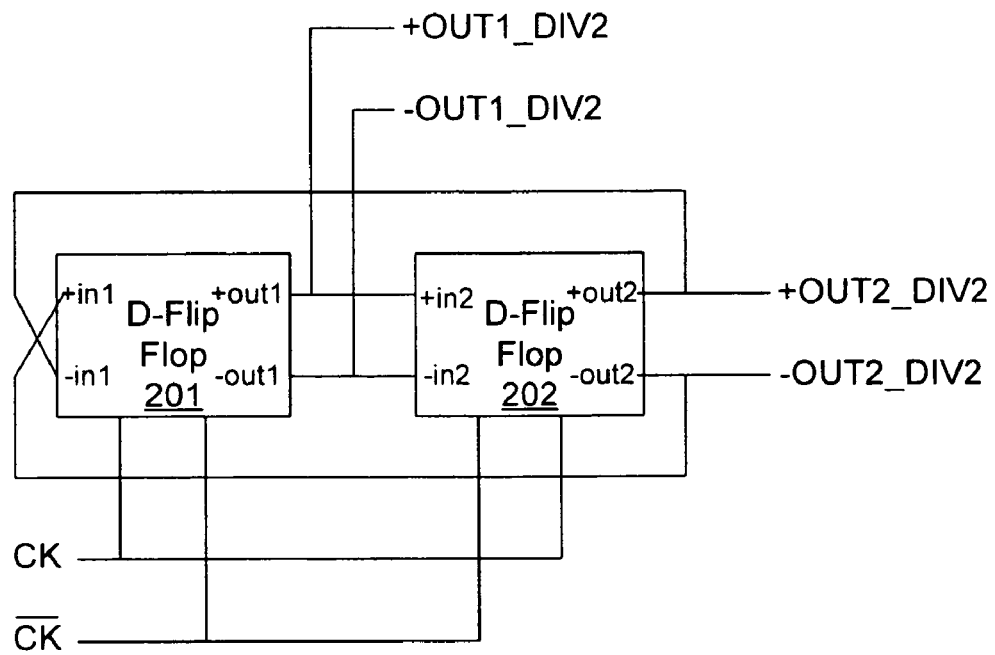
FIG. 2 illustrates a prior art D-Flip Flop divider circuit.
Figure 3:
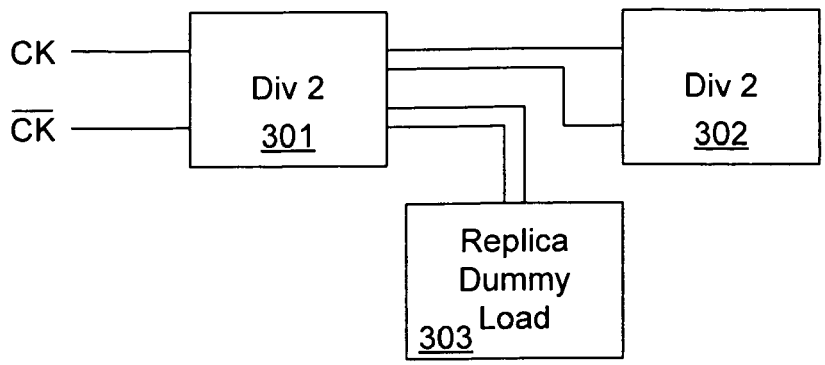
FIG. 3 illustrates a prior art approach used for series connected divider circuits.
Figure 4A:
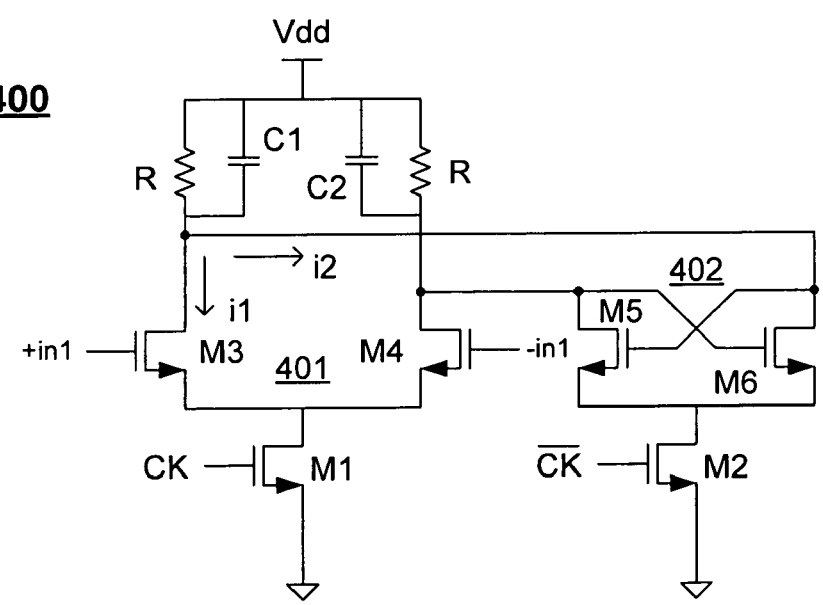
FIG. 4A illustrates a prior art implementation of a circuit that may be used in a divider circuit.
Figure 4B:
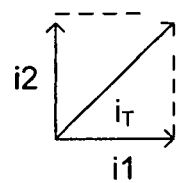
FIG. 4B illustrates the currents in the circuit of FIG. 4A.
Figure 5A:
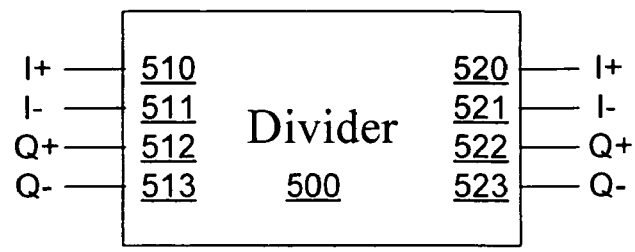
FIG. 5A illustrates a divider according to one embodiment of the present invention.

FIG. 5A illustrates a divider 500 according to one embodiment of the present invention. In one embodiment, the present invention includes a divider having four divider inputs 510-513 that receive an in-phase (I+) signal, a complement of the in-phase (I−) signal, a quadrature (Q+) signal (i.e., a signal that is 90 degrees out of phase from I+), and a complement of the quadrature (Q−) signal. The divider also includes four divider outputs that produce an in-phase (I+) signal, a complement of the in-phase (I−) signal, a quadrature (Q+) signal, and a complement of the quadrature (Q−) signal. The in-phase signal and the quadrature signal are separated from each other by 90 degrees (i.e., $\pi/2$). The complement of the in-phase signal is 180 degrees (i.e., $\pi$) out of phase from the in-phase signal, and the complement of the quadrature signal is 180 degrees (i.e., n) out of phase from the quadrature signal (i.e., 270 degrees or $3\pi/2$ from the in-phase signal). The in-phase signal may be referred to as the cosine signal ("cos(x)"), the quadrature signal may be referred to as the sinusoid signal ("sin(x)"), the complement of the in-phase signal may be referred to as the "complementary" in-phase signal or the negative (i.e. "minus") cosine signal ("−cos(x)"), and complement of the quadrature signal may be referred to as the "complementary" quadrature signal or the negative (i.e. "minus") sinusoid signal ("−sin(x)").

Figure 5B:
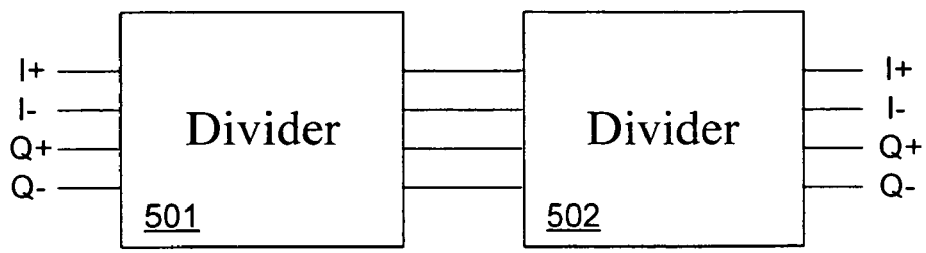
FIG. 5B illustrates series dividers according to another embodiment of the present invention.

FIG. 5B illustrates series dividers according to another embodiment of the present invention. One advantage of the present invention is that in some applications load balancing may be achieved. As shown if FIG. 5B, dividers according to the present invention may be coupled in series without the need for "dummy" devices or loads. In some embodiments, buffers may be used between the dividers if additional circuits are to be driven with the divider outputs. In this example, a first divider 501 includes four inputs for receiving I+, I−, Q+, and Q− signals. Divider 501 produces four signals I+, I−, Q+, and Q− on four divider outputs. Since divider 502 is also a four input divider, all of the outputs for divider 501 are coupled to inputs of divider 502. Thus, the load on divider 501 is balanced across all its outputs. In particular, divider 502 includes four inputs for receiving I+, I−, Q+, and Q− signals from divider 501. Divider 502 generates I+, I−, Q+, and Q− signals on four outputs, which may be used by subsequent stages for further processing.

Figure 6:
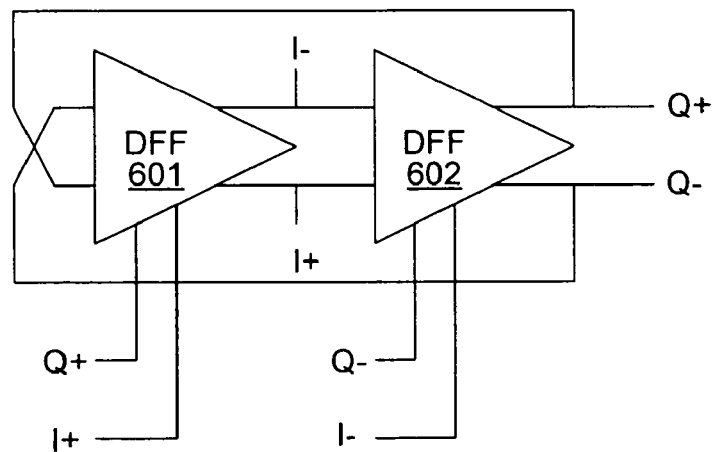
FIG. 6 is an example of a divider according to one embodiment of the present invention.

FIG. 6 is an example of a divider according to one embodiment of the present invention. Divider 600 is a D-type flip flop (DFF) implementation of a divide-by-two according to one example embodiment of the present invention. Divider 600 includes a first DFF 601 coupled in series with a second DFF 602. The output of DFF 601 is coupled to inputs of DFF 602. The output of DFF 602 is, in turn, coupled to inputs of DFF 601. The outputs of DFF 602 are cross coupled to the inputs of DFF 601 to introduce a reverse in polarization (i.e., −1).

According to one embodiment, the first input of a circuit (e.g., DFF 601 or DFF 602) receives a first signal and the second input of the circuit receives a signal that has a 90 degree (i.e., $\pi/2$) phase difference from the first signal. For example, the first input of DFF 601 receives a quadrature signal (Q+) and the second input of DFF 601 receives an in-phase signal (I+) (i.e., I is 90 degrees (i.e., $\pi/2$) from Q). Similarly, the first input of DFF 602 receives a complementary quadrature signal (Q−) and the second input of DFF 602 receives a complementary in-phase signal (I−). Each DFF produces two outputs. DFF 601 produces outputs I+ and I−. Likewise, DFF 602 produces outputs Q+ and Q−. These four outputs may be used to drive subsequent circuits in the system, for example.

Figure 7:
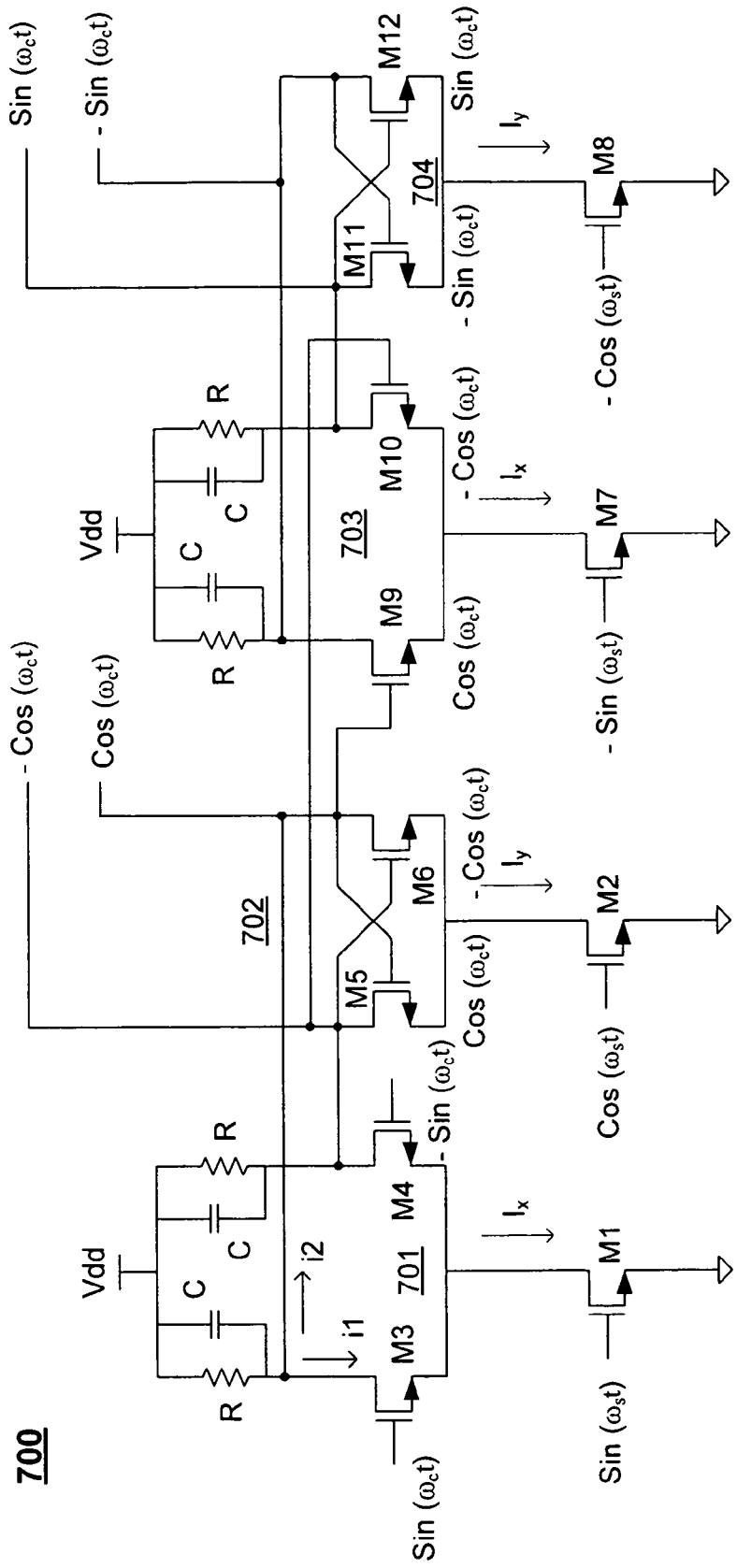
FIG. 7 is a detailed example of one implementation of a divider circuit according to one embodiment of the present invention.

FIG. 7 is a detailed example of one implementation of a divider circuit 700 according to one embodiment of the present invention. Divider circuit 700 includes a first differential circuit 701 and cross-coupled circuit 702 coupled to a common load. Here, the load includes resistors R and capacitors C, but a variety of other loads may be used that may include inductors or other devices. The nodes between the drains of M3 and M4 and components R and C are the output nodes of the first stage. The differential outputs are coupled to a second differential circuit 703 and cross-coupled circuit 704, which are also coupled to a common load (R and C). The nodes between the drains of M9 and M10 and components R and C are the output nodes of the second stage. The differential circuits and cross-coupled circuits receive a DC bias current from devices M1, M2, M7, and M8. For example, differential circuit 701 receives a bias current Ix from transistor M1, cross-coupled circuit 702 receives a bias currently from transistor M2, differential circuit 703 receives a bias current Ix from transistor M7, and cross-coupled circuit 704 receives a bias currently from transistor M8. The bias currents Ix and Iy may be generated using a variety of well-known techniques. However, the values of these bias currents may be tailored to improve circuit performance as described in more detail below.

Many of these differential and cross-coupled circuits may be coupled in series to implement a variety of divider circuits. In one implementation, the outputs of differential circuit 703 and cross-coupled circuit 704 (i.e., the drains of M9/M12 and M10/M11) are cross-coupled to inputs of differential circuit 701 (i.e., the gate of M3 and M4) to implement a divide-by-two. This implementation is advantageous for understanding advantages of the present invention.

Referring to FIG. 7 and the above description it can be seen that divider circuit 700 is configured in a ring. The phase of outputs of stages 701 and 702 may be represented as $\cos(\omega_c t)/-\cos(\omega_c t)$ and the phase of the outputs of stages 703 and 704 may be represented $\sin(\omega_c t)/-\sin(\omega_c t)$. The outputs of stages 703 and 704 are cross-coupled to the input stage 701 so that the circuit, in the absence of any other inputs, will oscillate at the circuit's free running frequency (i.e., the center frequency or resonant frequency). Differential circuit 701 includes first and second input terminals (e.g., the gates of M3/M4) that receive a first differential signal from stage 703/704. Differential circuit 701 also includes a first frequency control input for receiving a frequency control signal (e.g., the gate of M1). Cross-coupled circuit 702 includes a first transistor (here, and MOS transistor M6) having a first control terminal coupled to a second output of the cross-coupled circuit (here, the drain of MOS transistor M5) and the first differential output node (e.g., the drain of M4). Cross-coupled circuit 702 also includes a second transistor (M5) having a control terminal coupled to a first output of the cross coupled circuit (the drain of M6) and the second differential output node (e.g., the drain of M3). Cross-coupled circuit 702 further includes a second frequency control input (e.g., the gate of M2). Differential stages 703 and 704 are similarly configured.

The frequency control input for differential stage 701 receives quadrature signal, which may be represented by $\mathrm{Sin}(\omega_s t)$. The frequency control input for cross-coupled stage 702 receives in-phase signal, which may be represented by $\mathrm{Cos}(\omega_s t)$. The frequency control input for differential stage 703 receives complementary quadrature signal, which may be represented by $-\mathrm{Sin}(\omega_s t)$. Finally, the frequency control input for cross-coupled stage 704 receives complementary in-phase signal, which may be represented by $-\mathrm{Cos}(\omega_s t)$.

As mentioned above, when no inputs are applied to the frequency control inputs, the system will self-oscillate at the free running frequency. However, when frequency control input signals are provided, the system frequency will lock to one-half the signal frequency at the frequency control inputs. When the system is locked, the following relationship will hold:

$$\omega_s = 2\omega_c,$$

where $\omega_s$ is the frequency of the signals at the frequency control inputs (here, the gates of M1, M2, M7, and M8) and $\omega_c$ is the output frequency of the circuit. Thus, when the system is locked, the output frequency will be equal to one-half the input frequency (which is the desired result for a divide-by-two circuit). The ability of the circuit to lock can be influenced by the strength of the currents in each stage. For instance, differential circuit 701 has an AC current component $i_1$ that is the product of the input signal at the gate of M3/M4 with the quadrature component of the input signal (i.e., $\mathrm{Sin}(\omega_s t)$) at the frequency control input (here, the gate of M1). Cross-coupled circuit 702 also has an AC current component $i_2$ that results from applying the in-phase component of the input signal (i.e., $\mathrm{Cos}(\omega_s t)$) to the second frequency control input (here, the gate of M2).

For differential circuit 701, the inputs will generate an AC current component $i_1$ as follows:

$$i_1 = \mathrm{Sin}(\omega_s t)\mathrm{Sin}(\omega_c t)$$

where the $i_1$ is the product of the input signal at the gate of M3/M4, which contributes an $\omega_c$ component, and the frequency control input signal, which contributes component at the input signal frequency to be divided ($\omega_s$). Applying a well-known trigonometric identity, the AC current in differential stage 701 is given as follows:

$$i_1 = \tfrac{1}{2}[\mathrm{Cos}(\omega_s - \omega_c)t - \mathrm{Cos}(\omega_s + \omega_c)t]$$

However, the component of interest is the difference term, and the load may be tailored to filter out the summation term. Thus, the AC component of differential stage 701 may be given as:

$$i_1 = \tfrac{1}{2}[\mathrm{Cos}(\omega_s - \omega_c)t]$$

Similarly, the AC component of the output current $i_2$ is given as follows:

$$i_2 = \mathrm{Cos}(\omega_s t)\mathrm{Cos}(\omega_c t)$$

This current equation is the result of applying the in-phase component of the input signal (i.e., $\mathrm{Cos}(\omega_s t)$) to the second frequency control input, which will mix with the output frequency in cross-coupled stage 702 (here, $\mathrm{Cos}(\omega_c t)$) to produce the above output current (note that the control terminals of the cross-coupled stage are controlled by the output signals ±Cos($\omega_c$t). Applying another trigonometric identity, the AC current in cross-coupled stage 702 is given as follows:

$$i_2 = \frac{1}{2}[Cos(\omega_s - \omega_c)t + Cos(\omega_s + \omega_c)t].$$

which after filtering is as follows:

$$i_2 = \frac{1}{2}[Cos(\omega_s - \omega_c)t]$$

Thus, the currents $i_1$ and $i_2$ have the same phase. Because these currents are phase aligned, the resulting current vector will be stronger, which will improve the ability of the circuit to lock to the desired output frequency. Intuitively, it can be seen that the input to the first frequency control input is shifted by 90 degrees. Thus, by applying a signal to the second input that is also shifted by 90 degrees, the resulting currents are aligned. Accordingly, if the inputs are separated in phase by 90 degrees, the lock range is improved because the resulting currents will be more closely phase aligned (e.g., in this case exactly phase aligned). While the above description is presented in terms of a divide-by-two implemented using differential and cross-coupled circuits, it will be evident that the above principle may be applied in many other applications, configurations, and implementations.

Figure 8:
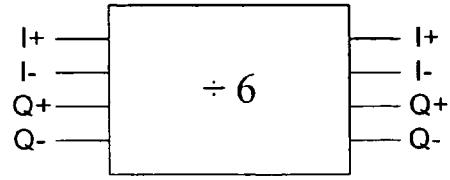
FIG. 8 is an example of a divide-by-six according to one embodiment of the present invention.

FIG. 8 is an example of a divide-by-six 800 according to one embodiment of the present invention. In one embodiment, the present invention includes a divide-by-six having four divider inputs that receive an in-phase (I+) signal, a complement of the in-phase (I−) signal, a quadrature (Q+) signal, and a complement of the quadrature (Q−) signal. Divider 800 also includes four divider outputs that produce an in-phase (I+) signal, a complement of the in-phase (I−) signal, a quadrature (Q+) signal, and a complement of the quadrature (Q−) signal.

Figure 9:
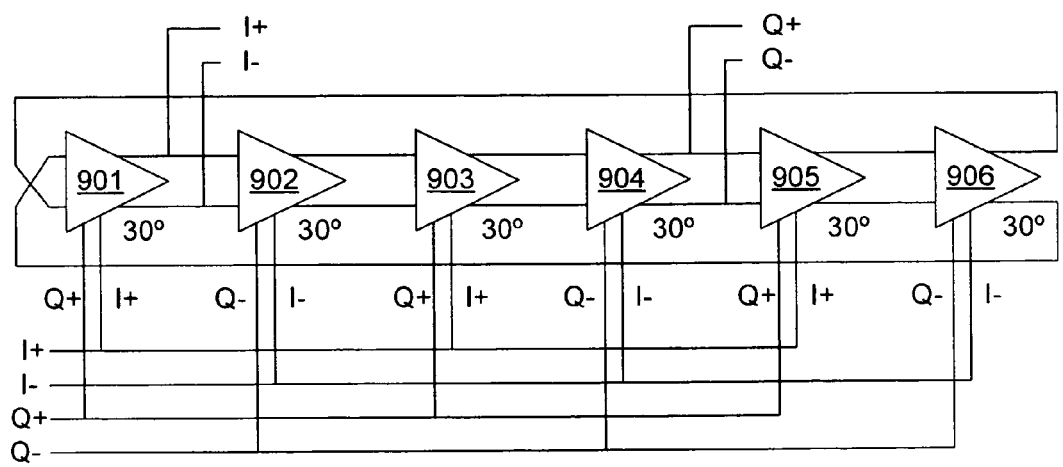
FIG. 9 is an example of a divide-by-six according to one embodiment of the present invention.

FIG. 9 is an example implementation of a divide-by-six. Divide-by-six 900 may include six circuits 901-906 connected in a ring that will oscillate at the free running frequency in the absence of frequency control inputs. In this case, each stage introduces 30 degrees of phase shift, and the cross coupled inputs into the first stage introduces 180 degrees of phase shift. The six circuits may be D-type flip-flops (DFF), for example, that each receives two frequency control inputs on frequency control input terminals. For example, DFF 901 receives Q+ and I+, DFF 902 receives Q− and I−, DFF 903 receives Q+ and I+, DFF 904 receives Q− and I−, DFF 905 receives Q+ and I+, and DFF 906 receives Q− and I−. When inputs are received, the system will lock to a frequency that is one-sixth of the input frequency. At lock, the following equation will be satisfied:

$$\omega_s = 6\omega_c,$$

In-phase and quadrature outputs may be taken from multiple locations in divide-by-six 900. In this example, the outputs are taken from DFF 901 and DFF 904.

FIG. 10A is an example of a D-type flip flop 1000 used in a divide-by-six according to one embodiment of the present invention. Initially, the output is running at the resonant frequency of the circuit. The output signal will propagate around the ring, and each differential circuit 1001 will have differential inputs +in1 and −in1 that receive a signal at the resonant frequency. If an input signal, $\omega_s$, having a frequency close to six times the resonant frequency is applied at the frequency control inputs in2 and in2', then the output signal will lock to a frequency equal to one-sixth in input frequency. The current $i_1$ will be the product of the output frequency of the previous stage applied to inputs +/− in1 (i.e., $\omega_c$) and the frequency control input signal applied at the gate of M1 (i.e., $\omega_s$):

$$i_1 = [Sin(\omega_c t) + (\frac{1}{3})Sin(3\omega_c t) + (\frac{1}{5})Sin(5\omega_c t) + \ldots][I_{xdc} + i_{xac}],$$

where the first term is the Fourier Expansion of the differential pair input signal +/−in1 and the second term includes the AC and DC components of the current from M1 (i.e., the bias current and the input signal). The AC and DC components of current from M1 may be represented as follows:

$$I_{xdc} = Ix; \text{ and}$$

$$i_{xac} = Sin(\omega_s t),$$

where the AC input signal, $\omega_s$, is equal to six times the output signal, $\omega_c$, (i.e., $\omega_s = 6\omega_c$) when the system is locked. Many of the frequency components of ii will be outside the lock range of the circuit. However, the frequency control input signal will combine with the Sin(5$\omega_c$t) component received by the differential pair M3/M4 to produce a component that is within the lock range of the circuit. For instance, the mixing action of the differential circuit 1001 will produce a current $i_1$ having a frequency component at:

$$\omega_s - 5\omega_c.$$

Since $\omega_s = 6\omega_c$ at lock, the current $i_1$ will have a frequency component at $$6\omega_c - 5\omega_c = \omega_c$$

Thus, the current $i_1$ will have a frequency component at the output frequency, which is the desired result. Similarly, the AC component of the output current $i_2$ is given as follows:

$$i_2 = [Sin\,\omega_c(t+30°) + (\frac{1}{3})Sin\,3\omega_c(t+30°) + (\frac{1}{5})Sin\,5\omega_c(t+30°) + \ldots][I_{ydc} + i_{yac}],$$

where the input signal from M2 (i.e., $I_{ydc} + i_{yac}$) is mixed with the output signal in the cross-coupled circuit 1002. Note that output signal is a version of +/−in1 shifted by the delay of the DFF, which is 30 degrees in this case.

FIG. 10B-C illustrates the currents in the circuit of FIG. 10A generated by different inputs. Maximizing the sum of $i_1$ and $i_2$ will improve the locking capability of the circuit. FIG. 10B illustrates the relationship between $i_1$ and $i_2$ when an input signal and the complement of the input signal are applied to the frequency control inputs (here, the gates of M1 and M2). Since the inputs are 180 degrees out of phase, the resulting current $i_2$ will be 150 degrees out of phase with $i_1$. The resulting current vector $i_T$ is less than either $i_1$ or $i_2$. Thus, in one embodiment, a divide-by-six circuit may receive an input only at the terminal of M1. M2 will have a DC bias Iy, but will receive no AC input signal. FIG. 10C illustrates the relationship between $i_1$ and $i_2$ when the difference between the frequency control input signals is 90 degrees (e.g., wherein the gate of M1 receives quadrature signal (Q+) and the gate of M2 receives in-phase signal (I+)). The current $i_2$ is effectively shifted by 90 degrees, which causes the resulting vector $i_T$ to be greater than $i_1$ or $i_2$. Thus, in one embodiment, a divide-by-six circuit may receive in-phase and quadrature signals as illustrated in FIG. 9. Because the currents are adding constructively at the output, the configuration in FIG. 9 will have improved lock performance.

Figure 11:
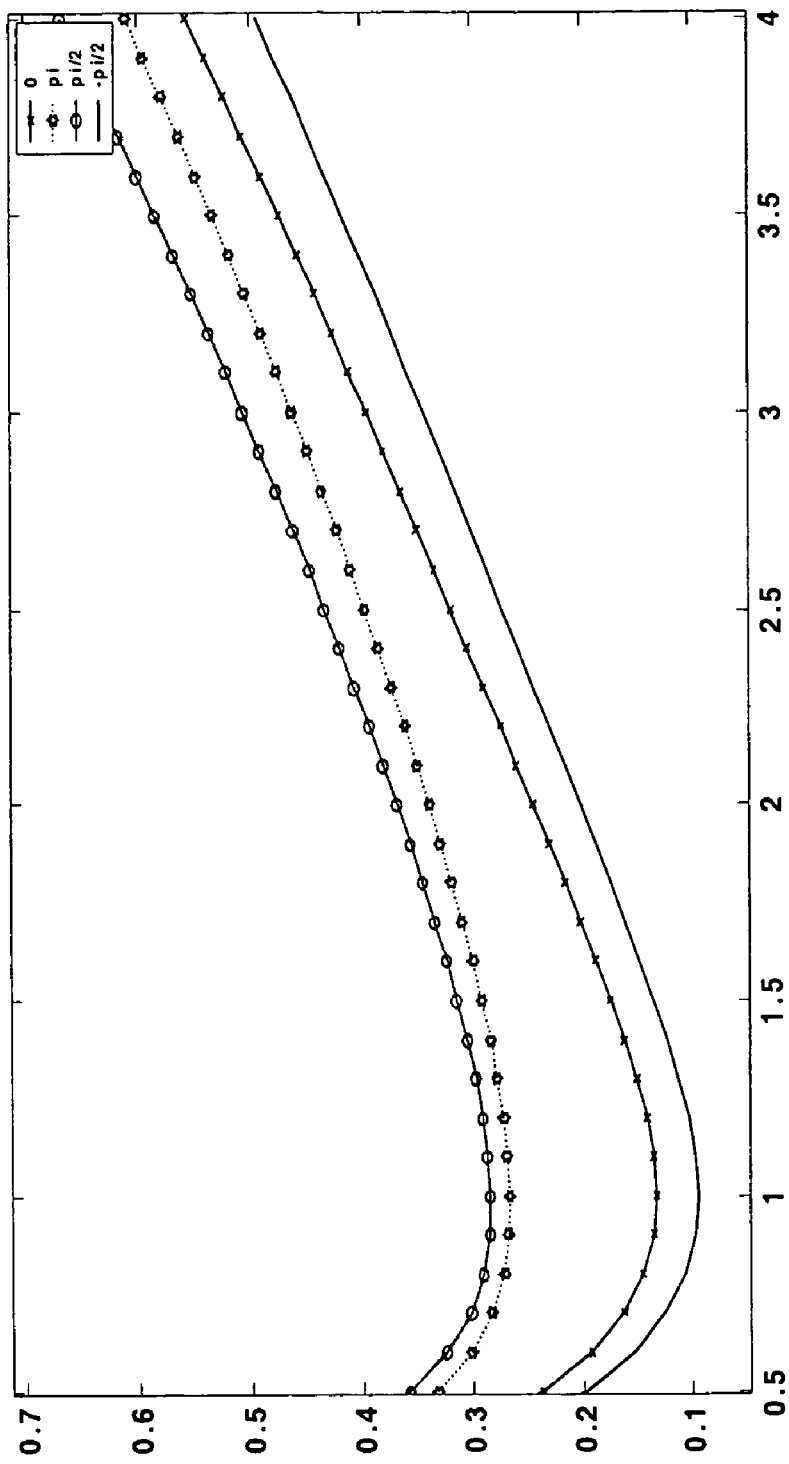
FIG. 11 is a graph showing lock range versus bias current ratios for a divide-by-two circuit according to one embodiment of the present invention.

FIG. 11 is a graph showing lock range versus bias current ratios for a divide-by-two circuit according to one embodiment of the present invention. As illustrated in FIGS. 7 and 9, embodiments of the present invention may be implemented using differential circuits that have a DC bias current Ix and cross coupled circuits that have a bias currently. As mentioned above, tailoring these currents can improve the performance of the divider. Generally, it is desirable to have Ix≧Iy to prevent possible latchup. Thus, Ix should be greater than or equal to Iy. Additionally, FIG. 11 illustrates that lock range is at a minimum when these current are equal. FIG. 11 demonstrates that lock range may be improved by setting Ix to be greater than Iy. It is particularly advantageous when the ratio of the DC bias current in the differential circuit (Ix) to the DC bias current in the cross coupled circuit (Iy) is between about 2-3. When Ix/Iy becomes larger than about 3, then the drawbacks of increased power consumption may overrule the advantages of the improved lock range. FIG. 11 illustrates lock range versus Ix/Iy for various combinations of inputs to the gates of M1 and M2. In particular, the graph shows the lock range versus Ix/Iy for the cases when the phase of the signal received at M2 minus the phase of the signal received at M1 is 0°, 90°, 180°, and −90° (i.e., 0, π/2, π, −π/2). As described above, advantages in lock performance are achieved when input signal phases constructively combine to increase the total current having the desired frequency. Thus, because the input signal received on the first frequency control input (e.g., M1 and M7 in FIGS. 7 and 10) generates a current i, that is rotated in phase by +90 degrees, the current generated by the input signal on the second frequency control input will be phase aligned when second input is +90 degrees from the first input. This is shown in FIG. 11 by the uppermost curve corresponding to Pi/2 (π/2). When the phase difference between the input signals is Pi (π), the resulting currents are out of phase by 90 degrees and the lock performance is reduced. When the phase difference between the input signals is 0 degrees, the resulting currents are again out of phase by 90 degrees and the lock performance is again reduced. Finally, when the phase difference between the input signals is −Pi/2 (−π/2), the resulting currents are out of phase by 180 degrees and the lock performance is reduced even more.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. Based on the above disclosure and the following claims, other arrangements, embodiments, implementations and equivalents will be evident to those skilled in the art and may be employed without departing from the spirit and scope of the invention as defined by the claims. The terms and expressions that have been employed here are used to describe the various embodiments and examples. These terms and expressions are not to be construed as excluding equivalents of the features shown and described, or portions thereof, it being recognized that various modifications are possible within the scope of the appended claims.

What is claimed is:

1. An integrated circuit comprising:
   at least one first divider input receiving an in-phase (I+) signal;
   at least one second divider input receiving a complement of the in-phase (I−) signal:
   at least one third divider input receiving a quadrature (Q+) signal; and
   at least one fourth divider input receiving a complement of the quadrature (Q−) signal,
   wherein the integrated circuit comprises a divider and wherein the divider is a divide-by-two,
   wherein the divider comprises first and second D-type flip flops.

2. The integrated circuit of claim 1 wherein the first and second D-type flip flops each comprise:
   a differential circuit having first and second inputs to receive a first differential signal, a first frequency control input, and first and second differential output nodes; and
   a cross-coupled circuit having a first control terminal coupled to a second output of the cross-coupled circuit and the first differential output node, a second control terminal coupled to a first output of the cross coupled circuit and the second differential output node, and a second frequency control input.

3. The integrated circuit of claim 2 wherein the first frequency control input in the first D-type flip flop receives the quadrature signal, the second frequency control input in the first D-type flip flop receives the in-phase signal, the first frequency control input in the second D-type flip flop receives the complement of the quadrature signal, and the second frequency control input in the second D-type flip flop receives the complement of the in-phase signal.

4. An integrated circuit comprising:
   at least one first divider input receiving an in-phase (I+) signal;
   at least one second divider input receiving a complement of the in-phase (I−) signal;
   at least one third divider input receiving a quadrature (Q+) signal; and
   at least one fourth divider input receiving a complement of the quadrature (Q−) signal,
   wherein the divider is a divide-by-six,
   wherein the divider comprises first, second, third, fourth, fifth, and sixth D-type flip flops.

5. The integrated circuit of claim 4 wherein the first, second, third, fourth, fifth, and sixth D-type flip flops each comprise:
   a differential circuit having first and second inputs to receive a first differential signal, a first frequency control input, and first and second differential output nodes; and
   a cross-coupled circuit having a first control terminal coupled to a second output of the cross-coupled circuit and the first differential output node, a second control terminal coupled to a first output of the cross coupled circuit and the second differential output node, and a second frequency control input.

6. The integrated circuit of claim 5 wherein the first frequency control input in the first, third, and fifth D-type flip flops receive the quadrature signal, the second frequency control input in the first, third, and fifth D-type flip flops receive the in-phase signal, the first frequency control input in the second, fourth, and sixth D-type flip flops receive a first complement of the quadrature signal, and the second frequency control input in the second, fourth, and sixth D-type flip flops receive a first complement of the in-phase signal.

7. An integrated circuit comprising:
   at least one first divider input receiving an in-phase (I+) signal;
   at least one second divider input receiving a complement of the in-phase (I−) signal;
   at least one third divider input receiving a quadrature (Q+) signal;
   at least one fourth divider input receiving a complement of the quadrature (Q−) signal; and
   a plurality of circuits each comprising:
   a differential circuit having a first bias current; and
   a cross-coupled circuit having a second bias current,
   wherein the first bias current is greater than the second bias current.

8. The integrated circuit of claim 7 wherein the ratio of the first bias current to the second bias current is within a range from 2 to 3.

9. A divider circuit comprising:
two or more differential circuits each having first and second inputs to receive a first differential signal, a first frequency control input, and first and second differential output nodes, wherein the differential circuit has a first bias current; and
two or more cross-coupled circuits each having a first control terminal coupled to a second output of the cross-coupled circuit and the first differential output node, a second control terminal coupled to a first output of the cross-coupled circuit and the second differential output node, and a second frequency control input, wherein the cross-coupled circuit has a second bias current;
wherein a first frequency control input in a first differential circuit is coupled to a quadrature signal, a second frequency control input in a first cross-coupled circuit is coupled to an in-phase signal, a first frequency control input in a second differential circuit is coupled to a complement of the quadrature signal, and a second frequency control input in a second cross-coupled circuit is coupled to a complement of the in-phase signal.

10. The divider circuit of claim 9 wherein the divider circuit is a divide-by-two.

11. The divider circuit of claim 9 wherein the ratio of the first bias current to the second bias current is within a range from 2 to 3.

12. The method of claim 9 wherein the first bias current is greater than the second bias current.

13. A method of dividing a frequency of a signal comprising:
receiving an in-phase (I+) signal on at least one first input of a divider;
receiving a complement of the in-phase (I−) signal on at least one second input of the divider;
receiving a quadrature (Q+) signal on at least one third input of the divider; and
receiving a complement of the quadrature (Q−) signal on at least one fourth input of the divider,
wherein the quadrature signal is received on a frequency control input of a differential circuit in a first D-type flip flop, the in-phase signal is received on a frequency control input of a cross-coupled circuit in the first D-type flip flop, the complement of the quadrature signal is received on a frequency control input of a differential circuit in a second D-type flip flop, and the complement of the in-phase signal is received on a frequency control input of a cross-coupled circuit in the second D-type flip flop.

14. The method of claim 13 wherein the ratio of a bias current in the differential circuit to a bias current in the cross-coupled circuit is within a range from 2 to 3.

15. The method of claim 13 wherein a bias current in the differential circuit is greater than a bias current in the cross-coupled circuit.

16. A method of dividing a frequency of a signal comprising:
receiving an in-phase (I+) signal on at least one first input of a divider;
receiving a complement of the in-phase (I−) signal on at least one second input of the divider;
receiving a quadrature (Q+) signal on at least one third input of the divider; and
receiving a complement of the quadrature (Q−) signal on at least one fourth input of the divider,
wherein the quadrature signal is received on frequency control inputs of differential circuits in first, third, and fifth D-type flip flops, the in-phase signal is received on frequency control inputs of cross-coupled circuits in the first, third, and fifth D-type flip flops, the complement of the quadrature signal is received on frequency control inputs of differential circuits in second, fourth, and sixth D-type flip flops, and the complement of the in-phase signal is received on frequency control inputs of cross-couple circuits in the second, fourth, and sixth D-type flip flops.

17. The method of claim 16 wherein the ratio of a bias current in the differential circuit to a bias current in the cross-coupled circuit is within a range from 2 to 3.

18. The method of claim 16 wherein a bias current in the differential circuit is greater than a bias current in the cross-coupled circuit.

19. An integrated circuit comprising:
a divider circuit for dividing signal frequencies;
at least one first divider input receiving an in-phase (I+) signal;
at least one second divider input receiving a complement of the in-phase (I−) signal;
at least one third divider input receiving a quadrature (Q+) signal; and
at least one fourth divider input receiving a complement of the quadrature (Q−) signal,
wherein the divider comprises a differential circuit and a cross-coupled circuit, and wherein a bias current in the differential circuit is greater than a bias current in the cross-coupled circuit.

20. A method of dividing a frequency of a signal comprising:
receiving an in-phase (I+) signal on at least one first input of a divider circuit;
receiving a complement of the in-phase (I−) signal on at least one second input of the divider;
receiving a quadrature (Q+) signal on at least one third input of the divider; and
receiving a complement of the quadrature (Q−) signal on at least one fourth input of the divider,
wherein the divider circuit comprises a differential circuit and a cross-coupled circuit, and wherein a bias current in the differential circuit is greater than a bias current in the cross-coupled circuit.

* * * * *